United States Patent
Setiawan et al.

(10) Patent No.: US 11,688,785 B2
(45) Date of Patent: Jun. 27, 2023

(54) METAL SEMICONDUCTOR CONTACTS

(71) Applicant: GLOBALFOUNDRIES Singapore Pte. Ltd., Singapore (SG)

(72) Inventors: Yudi Setiawan, Singapore (SG); Handoko Linewih, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 209 days.

(21) Appl. No.: 16/831,746

(22) Filed: Mar. 26, 2020

(65) Prior Publication Data
US 2021/0305391 A1    Sep. 30, 2021

(51) Int. Cl.
*H01L 29/45*  (2006.01)
*H01L 29/16*  (2006.01)
*H01L 21/04*  (2006.01)
*H01L 29/78*  (2006.01)

(52) U.S. Cl.
CPC .......... *H01L 29/45* (2013.01); *H01L 21/0485* (2013.01); *H01L 29/1608* (2013.01); *H01L 29/452* (2013.01); *H01L 29/7802* (2013.01)

(58) Field of Classification Search
CPC ................ H01L 29/1608; H01L 29/45; H01L 21/02529; H01L 21/02378; H01L 21/02447

See application file for complete search history.

(56) References Cited

U.S. PATENT DOCUMENTS

| | | |
|---|---|---|
| 5,409,859 A | 4/1995 | Glass et al. |
| 5,980,265 A | 11/1999 | Tischler |
| 6,803,243 B2 | 10/2004 | Slater, Jr. et al. |
| 7,851,343 B2 | 12/2010 | Mayer et al. |
| 10,192,970 B1 | 1/2019 | Okojie |
| 2002/0115262 A1* | 8/2002 | Cabral, Jr. ........ H01L 21/28518 438/404 |
| 2013/0032811 A1* | 2/2013 | Kizilyalli ............ H01L 29/8083 257/E29.313 |
| 2013/0062622 A1* | 3/2013 | Tsuchiya ............. H01L 29/4933 257/77 |
| 2013/0062624 A1* | 3/2013 | Tsuchiya ............. H01L 29/7806 257/77 |
| 2013/0330571 A1 | 12/2013 | Varma et al. |
| 2016/0293423 A1* | 10/2016 | Yamada .............. H01L 21/0475 |

FOREIGN PATENT DOCUMENTS

CN    101335201 A    12/2008

OTHER PUBLICATIONS

Control of Ni/SiC reactions by germanium, studied on the atomic scale in Scripta Materialia 60 (2009) 858-861 to A. Hahnel et al. (Year: 2009).*

(Continued)

*Primary Examiner* — Eric A. Ward
(74) *Attorney, Agent, or Firm* — Anthony Canale (57) ABSTRACT

A semiconductor device is provided. The semiconductor device comprises a substrate having a first surface and a second surface, the substrate comprising a wide bandgap semiconductor material. An epitaxial layer is on the first surface of the substrate and a metal germanosilicide layer is above the second surface of the substrate. The metal germanosilicide layer forms an ohmic contact to the substrate.

18 Claims, 6 Drawing Sheets

(56) References Cited

OTHER PUBLICATIONS

Hui Guo, Da-yong Qiao, Yue-hu Wang, Yu-ming Zhang and Yi-men Zhang, "The Intermediate Semiconductor Layer for the Ohmic Contact to Silicon Carbide by Germanium Implantation," Extended Abstracts—2008 8th International Workshop on Junction Technology (IWJT '08), 2008, pp. 195-197 (Year: 2008).*

"Self-Aligned NiGeSi Contacts on Gallium Arsenide for III-V MOSFETs" ECS Transactions, 33 (6) 1021-1028 (2010) by Zingui Zhang et al. (Year: 2010).*

* cited by examiner

METAL SEMICONDUCTOR CONTACTS

FIELD OF THE INVENTION

The disclosed embodiments relate generally to metal semiconductor contacts, and more particularly, to metal semiconductor contacts for wide bandgap semiconductors with improved characteristics and the manufacture thereof.

BACKGROUND

Wide bandgap semiconductors materials such as silicon carbide (SiC) are semiconductor materials that enable devices to operate at higher voltages, frequencies and temperatures than conventional semiconductor materials such as silicon and gallium arsenide. Devices using wide bandgap materials include transistors and diodes. Typical applications of wide band gap devices include high voltage switches and rectifiers, light emitting diodes, lasers, and radio frequency applications.

Metal semiconductor contacts are widely used to connect devices in a circuit. A metal semiconductor contact may be a conductive layer formed on a semiconductor material. The conductive layer in a metal semiconductor contact may be a metal silicide layer. A metal silicide may be a compound of metal and silicon. The metal and silicon may be chemically bonded together in a metal silicide to form an ohmic contact. An ohmic contact is usually defined as a metal semiconductor contact that has a negligible contact resistance relative to a bulk or spreading resistance of the semiconductor. An appropriate ohmic contact will improve device performance as it provides current flow with a voltage drop that is sufficiently small as compared to a voltage drop across an active region of the device.

Several problems are associated with producing a metal silicide ohmic contact for wide bandgap semiconductors. Metal silicide ohmic contact fabrication typically includes a high temperature annealing above 1000° C. that detrimentally affects devices that are already present in a semiconductor substrate. Typical metal silicide ohmic contacts on a wide bandgap semiconductor may have a high electrical resistance with rough interfaces between metal silicide and semiconductor. The high electrical resistance of metal silicide ohmic contacts will negatively affect the performance of the devices present in the semiconductor substrate. The metal silicide ohmic contact on a wide bandgap semiconductor typically has a non-uniform physical thickness and comprises a mixture of crystalline and amorphous states leading to uneven and non-repeatable characteristics across a semiconductor surface. Poor adhesion between the metal silicide and wide bandgap semiconductor is also one of the challenges encountered.

Thus, there is a need for an improved metal silicide ohmic contact for wide bandgap semiconductors to overcome the challenges mentioned above.

SUMMARY

In an aspect of the present disclosure, a semiconductor device is provided. The semiconductor device comprises a substrate having a first surface and a second surface, the substrate comprising a wide bandgap semiconductor material. An epitaxial layer is on the first surface of the substrate and a first metal germanosilicide layer is above the second surface of the substrate. The first metal germanosilicide layer forms an ohmic contact to the substrate.

In another aspect of the present disclosure, a semiconductor device is provided. The semiconductor device comprises a substrate having a first surface and a second surface, the substrate comprising a wide bandgap semiconductor material. An epitaxial layer is on the first surface of the substrate. A first metal germanosilicide layer is above the second surface of the substrate and a second metal germanosilicide layer is above the epitaxial layer. The first metal germanosilicide layer forms an ohmic contact to the substrate and the second metal germanosilicide layer forms an ohmic contact to the epitaxial layer.

In yet another aspect of the present disclosure, a method of fabricating a semiconductor device is provided. The method comprises providing a substrate having a first surface and a second surface, the substrate comprises a wide bandgap semiconductor material. An epitaxial layer is on the first surface of the substrate and a metal germanosilicide layer is formed on the second surface of the substrate.

Numerous advantages may be derived from the embodiments described below. The embodiments provide metal semiconductor contacts with improved characteristics. The metal semiconductor contacts include metal germanosilicide. The improved characteristics include a metal germanosilicide layer with a uniform thickness, that is fully crystalline and having a low resistance. The metal germanosilicide layer forms a smooth interface with the semiconductor substrate and has a good adhesion to the semiconductor substrate. The improved characteristics lead to a better performance, repeatable characteristics and an ease of fabrication.

The embodiments further provide low temperature fabrication processes to manufacture the metal semiconductor contacts. The low temperature fabrication processes do not affect devices formed on the substrate and are easily integrated into a conventional device fabrication. The improved characteristics of the metal semiconductor contacts and the low temperature fabrication processes lead to better devices performance. The fabrication processes are self-aligned and do not require additional masking steps, making them simple and low cost. In addition, the fabrication processes are self-limiting and do not require additional engineering efforts to stop the processes.

BRIEF DESCRIPTION OF THE DRAWINGS

The disclosed embodiments will be better understood from a reading of the following detailed description, taken in conjunction with the accompanying drawings:

FIGS. 3A to 3E show a fabrication process flow for the semiconductor device shown in FIG. 1, according to embodiments of the disclosure.

FIGS. 4A to 4C show a fabrication process flow for a vertical drain transistor shown in FIG. 2, according to embodiments of the disclosure. FIGS. 4A to 4C are a continuation of FIGS. 3A to 3E.

For simplicity and clarity of illustration, the drawings illustrate the general manner of construction, and certain descriptions and details of well-known features and techniques may be omitted to avoid unnecessarily obscuring the discussion of the described embodiments of the devices. Additionally, elements in the drawings are not necessarily drawn to scale. For example, the dimensions of some of the elements in the drawings may be exaggerated relative to other elements to help improve understanding of embodiments of the devices. The same reference numerals in different drawings denote the same elements, while similar reference numerals may, but do not necessarily, denote similar elements.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

Figure 1:
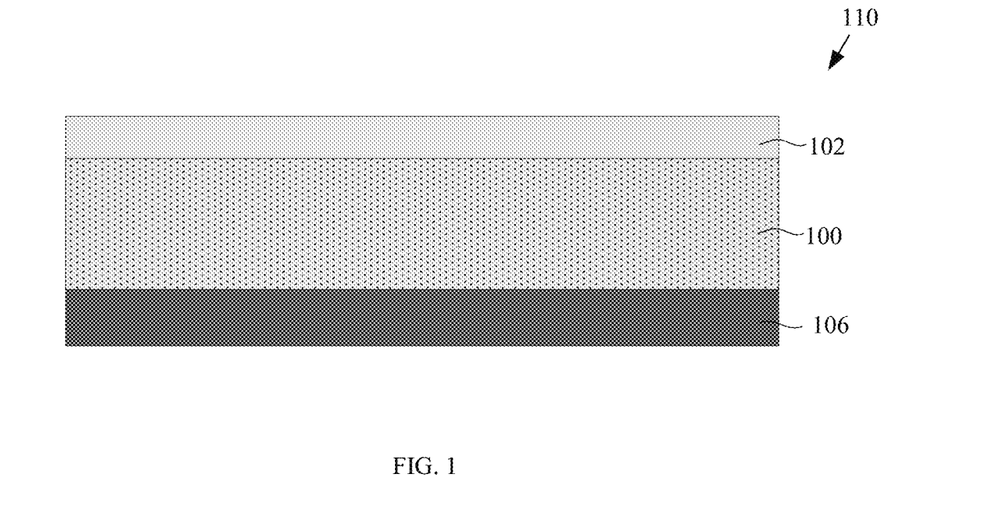
FIG. 1 is a cross-section view of a semiconductor device according to embodiments of the disclosure.

FIG. 1 is a cross-section view of a semiconductor device 110 according to embodiments of the disclosure. Referring to FIG. 1, the semiconductor device 110 includes a substrate 100 and a metal germanosilicide layer 106 below the substrate 100. In embodiments, an active layer 102 is on the substrate 100. The active layer 102 is an optional layer. In embodiments, the active layer 102 is on an opposite side of the substrate 100 from the metal germanosilicide layer 106.

The substrate 100 may be made of silicon carbide or any other wide bandgap semiconductor material. The term "wide bandgap semiconductors" may be semiconductor materials with bandgap energy in the range of 2 to 6 eV, at room temperature. A bandgap refers to a difference in energy between a valence band and a conduction band of a semiconductor that consists of a range of energy values forbidden to electrons in the semiconductor. A valence band is a band of electron orbitals that electrons can jump out of, moving into a conduction band when excited. The valence band is the outermost electron orbital of an atom of any specific material that electrons actually occupy. The conduction band is the band of electron orbitals that electrons can jump up into from the valence band when excited. When the electrons are in these orbitals, they have enough energy to move freely in the material. This movement of electrons creates an electric current.

The term "metal germanosilicide" may be a compound of germanium, silicon and metal. The germanium, silicon and metal are chemically bonded together in a metal germanosilicide. In embodiments, the metal germanosilicide layer 106 contains silicon and germanium with a range in ratio of silicon to germanium from 95:5 to 60:40. In some embodiments, the range in ratio of silicon to germanium is higher than 95:5. In embodiments, the range in ratio of silicon to germanium is lower than 60:40.

In embodiments, the metal germanosilicide layer 106 has a uniform thickness. In embodiments, the metal germanosilicide layer 106 forms a smooth interface with the substrate 100. In embodiments, the metal germanosilicide layer 106 forms an ohmic contact to the substrate. In embodiments, the metal germanosilicide layer 106 has a sheet resistance with a range not limited to between 5Ω per square to 50Ω per square. The term "sheet resistance" may be a resistance of a thin sheet of material which when multiplied by a thickness of the material gives a value of resistivity. The sheet resistance of the metal germanosilicide layer 106 may vary depending on the metal in the metal germanosilicide layer 106 and the germanium content in the metal germanosilicide layer 106. In embodiments, the sheet resistance of the metal germanosilicide layer 106 varies depending on the ratio of metal to germanium and metal to silicon.

The metal germanosilicide layer 106 may contain carbon. The carbon may be introduced during formation of the metal germanosilicide layer 106. In embodiments, the carbon may be introduced when an upper portion of the substrate 100 is partially consumed during formation of the metal germanosilicide layer 106. In embodiments, the metal germanosilicide layer 106 has a good adhesion to the substrate 100.

In embodiments, the metal germanosilicide layer 106 is at least partially crystalline. In some embodiments, the metal germanosilicide layer 106 is fully crystalline. In embodiments, the metal germanosilicide layer 106 may be nickel germanosilicide with crystalline orientations of <031>, <301>, any other crystalline orientations or its combinations. In embodiments, the metal in the metal germanosilicide layer 106 comprises titanium, nickel, cobalt, chromium, palladium, zirconium, platinum, tantalum, any other suitable metal or its combination.

The active layer 102 may include devices such as transistors, diodes, capacitors, resistors, any other suitable devices or its combinations. In embodiments, the active layer 102 includes an epitaxial layer. The devices of the active layer 102 may be on the substrate 100 or the epitaxial layer of the active layer 102.

Figure 2:
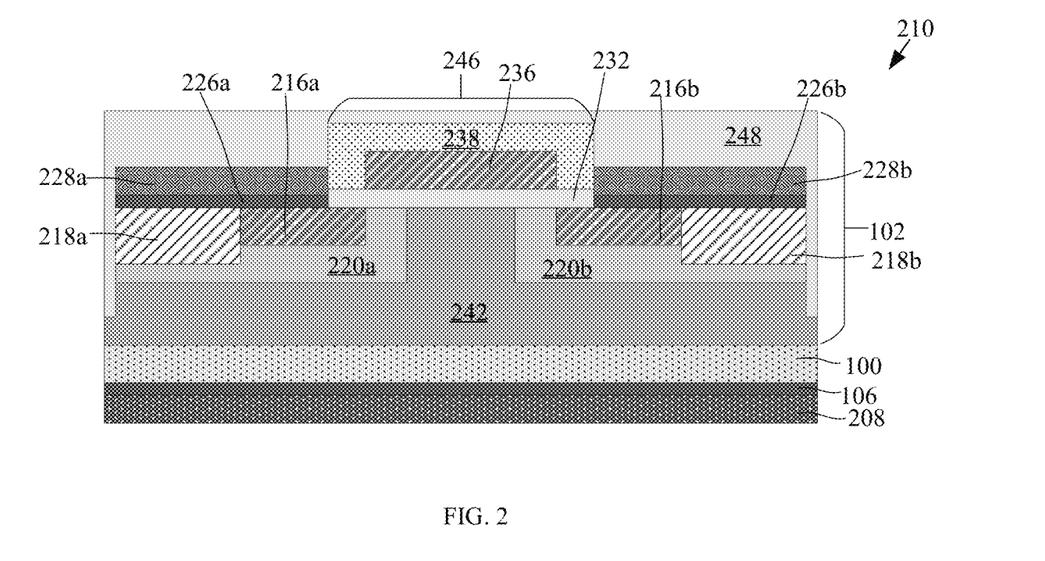
FIG. 2 is a cross-section view of a semiconductor device, according to embodiments of the disclosure.

The embodiments shown in FIG. 1 may be modified to create alternative embodiments within the scope of this disclosure. For example, FIG. 2 is a cross-section view of a semiconductor device 210, according to another embodiment of the disclosure. The same reference numbers used in FIG. 1 are also used in FIG. 2 to refer to identical features.

Referring to FIG. 2, the semiconductor device 210 includes a substrate 100 and a metal germanosilicide layer 106 below the substrate 100. An active layer 102 may be on the substrate 100. In embodiments, the active layer 102 is on an opposite side of the substrate 100 from the metal germanosilicide layer 106. In embodiments, the metal germanosilicide layer 106 separates the substrate 100 from a metal layer 208.

The substrate 100 may be made of silicon carbide or any other suitable wide bandgap semiconductor material. In embodiments, the substrate 100 may be made of silicon carbide with a hexagonal, cubic, rhombohedral or any other suitable crystal orientation. The substrate 100 may be an n-doped, p-doped or undoped semiconductor. The substrate 100 may be heavily doped having a carrier concentration range from approximately $10^{19}$ to $10^{20}$ cm$^{-3}$. In embodiments, the substrate 100 is doped with a carrier concentration range lower than $10^{19}$ cm$^{-3}$. In some embodiments, the substrate 100 is doped with a carrier concentration range higher than $10^{20}$ cm$^{-3}$. In embodiments, the substrate 100 has a thickness with a range not limited to between 50 μm to 200 μm. In embodiments, the structure 210 is a vertical device or a vertical drain transistor and the substrate 100 is a drain region of the vertical drain transistor 210.

The active layer 102 may include doped semiconductor regions such as source regions 216a and 216b, base regions 220a and 220b and base terminals 218a and 218b. The source regions 216a and 216b may collectively be referred to as source regions 216. The base terminals 218a and 218b may collectively be referred to as base terminals 218. The base regions 220a and 220b may collectively be referred to as base regions 220.

In embodiments, the source regions 216 are n-doped and the base terminals 218 are p-doped. The source regions 216 may be doped with phosphorus, nitrogen, or any other suitable dopants. The base regions 220 may be p-doped. The base terminals 218 and base regions 220 may be doped with boron, aluminium, berrylium, gallium or any other suitable dopants. In embodiments, the source regions 216 and base terminals 218 are more heavily doped as compared to the base regions 220.

The active layer 102 may include an epitaxial layer 242. In embodiments, the epitaxial layer 242 is a drift region of the vertical drain transistor 210. The source regions 216, base terminals 218 and base regions 220 may be formed in the epitaxial layer 242. The epitaxial layer 242 is positioned between the substrate 100 and the source regions 216, base terminals 218 and base regions 220. In embodiments, the epitaxial layer 242 may be made of gallium nitride, aluminum gallium nitride, indium gallium nitride, silicon oxides, gallium oxides, aluminum oxides or indium oxides. In embodiments, the vertical drain transistor 210 is an n-channel transistor. In embodiments, the epitaxial layer 242 is n-doped. In embodiments, the substrate 100 is n-doped. The substrate 100 may be more heavily doped as compared to the epitaxial layer 242. In embodiments, the source regions 216 are more heavily doped as compared to the substrate 100.

In an alternative embodiment, the vertical drain transistor 210 is a p-channel transistor. In embodiments, the epitaxial layer 242 is p-doped and is more lightly doped as compared to the substrate 100. In embodiments, the substrate 100 is p-doped. In embodiments, the source regions 216 are p-doped. In embodiments, the base terminals 218 are n-doped. The base terminals 218 may be more heavily doped than the base regions 220. In embodiments, the base regions 220 are n-doped.

The active layer 102 may include a gate structure 246. The gate structure 246 may include a gate dielectric layer 232 and a conductive gate electrode 236 formed on the gate dielectric layer 232. The gate structure 246 may include spacer structure 238 covering side surfaces and top surface of the conductive gate electrode 236. Bottom portions of the spacer structure 238 are formed on the gate dielectric layer 232. The gate structure 246 may be formed on the epitaxial layer 242. The gate electrode layer 236 of the gate structure 246 may be made of polysilicon, metals including titanium nitride, tantalum, tantalum nitride, tungsten, cobalt, aluminium, molybdenum, any other suitable conductive material or its combination. The gate dielectric layer 232 of the gate structure 246 may be made of silicon dioxide, silicon nitride, metal oxide including aluminum oxide, hafnium oxide, titanium oxide, lanthanum oxide, zirconium oxide, any other suitable dielectric material or its combination. The spacer structure 238 may be made of silicon dioxide, silicon nitride, silicon oxynitride, any other suitable dielectric material or its combination.

The active layer 102 may include source contacts 226a and 226b. Source contact 226a may be formed on the epitaxial layer 242 thereby forming an ohmic contact to the epitaxial layer 242. The source contact 226a may be adjacent to the gate structure 246. Source contact 226b may be formed on the epitaxial layer 242 thereby forming an ohmic contact to the epitaxial layer 242. The source contact 226b is adjacent to an opposite side of the gate structure 246 from the source contact 226a. The source contacts 226a and 226b may collectively be referred to as source contacts 226. In embodiments, the source contacts 226 may be made of metal germanosilicide, metal silicide, aluminium, titanium, any other suitable conductive material or its combination. The source contacts 226 may contain the same material or different material as the metal germanosilicide layer 106. Metal layers 228a and 228b, respectively may be formed on the source contacts 226a and 226b, respectively. The metal layers 228a and 228b may be made of aluminium, nickel, titanium, platinum, palladium, gold, any other suitable metals or its combinations. In embodiments, the source contacts 226 are formed on the source regions 216 and base terminals 218.

A side portion of the gate dielectric layer 232 covers a side portion of the source region 216a. A side portion of the gate dielectric layer 232 opposite to the side portion of the gate dielectric layer 232 covering the side portion of the source region 216a covers a side portion of the source region 216b. The base terminals 218a and 218b are adjacent to the source regions 216a and 216b, respectively. The source region 216a and base terminal 218a are formed on the base region 220a. The source region 216b and base terminal 218b are formed on the base region 220b. A side portion of the base region 220a is covered by a side portion of the gate dielectric layer 232. A side portion of the gate dielectric layer 232 opposite to the side portion of the gate dielectric layer 232 covering the side portion of the base region 220a covers a side portion of the base region 220b. An upper portion of the epitaxial layer 242 separates the base region 220a from the base region 220b. A lower portion of the epitaxial layer 242 separates the base regions 220a and 220b from the substrate 100. An insulating material 248 may be formed on the gate structure 246, the metal layers 228a and 228b, source contacts 226a and 226b, source regions 216a and 216b, base terminals 218a and 218b, base regions 220a and 220b and the epitaxial layer 242. The insulating material 248 may be an interlayer dielectric (ILD), polyimide, any other suitable insulating material or its combination.

The operating principle of the semiconductor device 210 will be described, with reference to FIG. 2. On application of a positive voltage on the conductive gate electrode 236 in the state where a voltage is applied between the metal layers 228 and the metal layer 208, an electron inversion layer is formed on surfaces of the base regions 220a and 220b. As a result, an electric current flows from the metal layer 208 to the metal layers 228 through the metal germanosilicide layer 106, substrate 100, epitaxial layer 242, base regions 220a and 220b, source regions 216a and 216b and source contacts 226a and 226b.

Figure 3A:
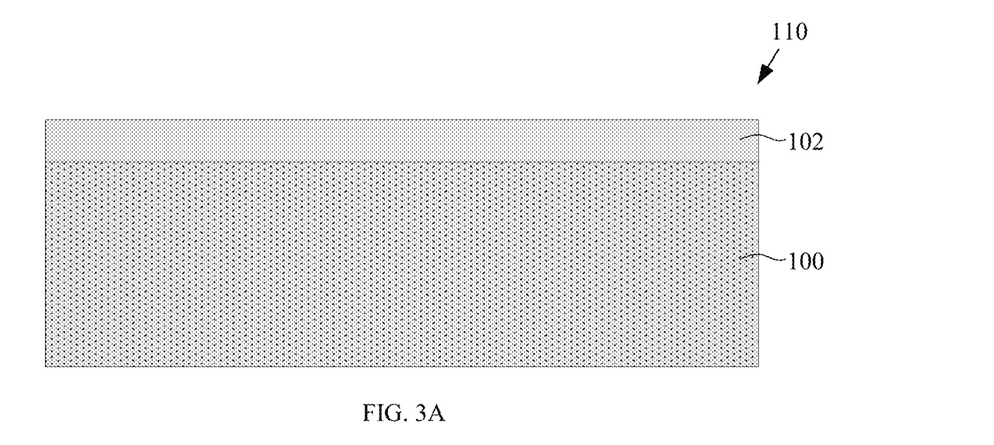
FIG. 3A is a cross-section view of a partially completed semiconductor device, according to embodiments of the disclosure.

FIGS. 3A to 3E show a fabrication process flow for the semiconductor device 110 shown in FIG. 1, according to embodiments of the disclosure. FIG. 3A is a cross-section view of a partially completed semiconductor device 110, according to embodiments of the disclosure. Referring to FIG. 3A, a substrate 100 is provided. The substrate 100 may include an active layer 102 on the substrate 100.

Figure 3B:
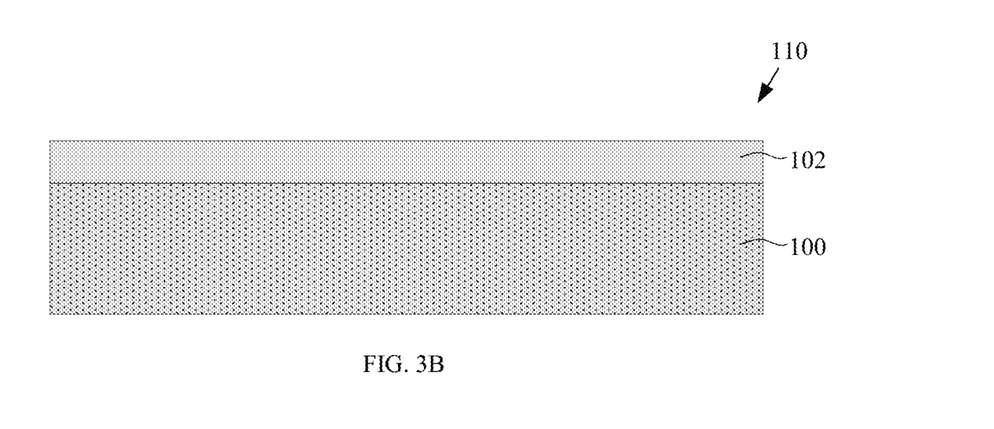
FIG. 3B is a cross-section view of a partially completed semiconductor device after removal of a portion of a substrate, according to embodiments of the disclosure.

FIG. 3B is a cross-section view of a partially completed semiconductor device 110 after removal of a portion of the substrate 100, according to embodiments of the disclosure. The removal process may be by grinding, polishing, any other suitable removal processes or its combinations. The polishing process may be a chemical mechanical polishing or any other suitable polishing process. In embodiments, a purpose of the removal process is to provide a substrate 100 with a suitable thickness to function as a drain region of a transistor. In embodiments, the removal process provides a substrate 100 with a flat surface, good surface quality and having low thermal resistance for the semiconductor device 110. In embodiments, the removal process is an optional process. A portion of the substrate 100 remains below the active layer 102 after the removal process. In embodiments, the portion of the substrate 100 has a thickness with a range between 50 μm to 200 μm. A chemical cleaning process may be applied on the substrate 100 after the removal process. The chemical cleaning process may include standard RCA cleaning, any other suitable cleaning processes or its combinations.

Figure 3C:
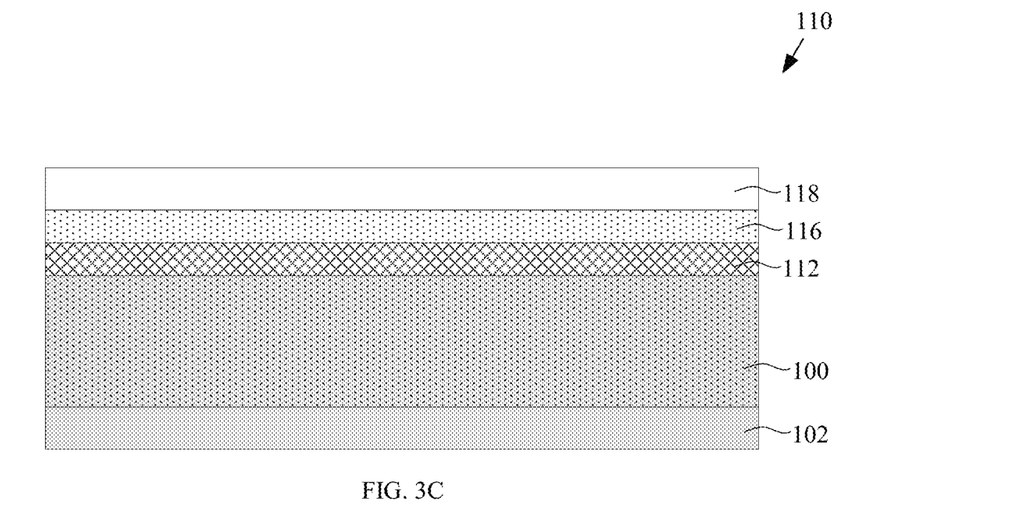
FIG. 3C is a cross-section view of a partially completed semiconductor device after depositing a layer of low melting point material over the substrate, depositing a layer of metal and an encapsulation material, according to embodiments of the disclosure.

FIG. 3C is a cross-section view of a partially completed semiconductor device 110 after depositing a layer of low melting point material 112 over the substrate 100, depositing a layer of metal 116 and an encapsulation material 118, according to embodiments of the disclosure. The encapsulation material 118 is an optional layer and may be deposited over the layer of metal 116. The metal layer 116 may be deposited over the layer of low melting point material 112. In embodiments, the low melting point material 112 includes germanium, silicon germanium, silicon, any other suitable material or its combination. In embodiments, the low melting point material 112 may be amorphous, crystalline or a mixture of amorphous and crystalline. The metal layer 116 may include titanium, nickel, cobalt, chromium, palladium, zirconium, platinum, tantalum, any other suitable metal or its combination.

In embodiments, a ratio of the thicknesses of the low melting point material 112 to the metal layer 116 is in the range of 1:2 to 2:1. In some embodiments, the ratio of the thicknesses of the low melting point material 112 to the metal layer 116 is lower than 1:2. In some embodiments, the ratio of the thicknesses of the low melting point material 112 to the metal layer 116 is higher than 2:1. The ratio of the thicknesses of the low melting point material 112 to the metal layer 116 may vary depending on the metal layer 116 materials. The deposition processes for the low melting point material 112, metal layer 116 and encapsulation material 118 may be by chemical vapor deposition (CVD), atomic layer deposition (ALD), physical vapor deposition (PVD), any other suitable deposition process or its combination.

The term "low melting point material" may be a material having a melting point below a melting point of the semiconductor substrate 100. In embodiments, the low melting point material 112 may be a semiconductor material.

Figure 3D:
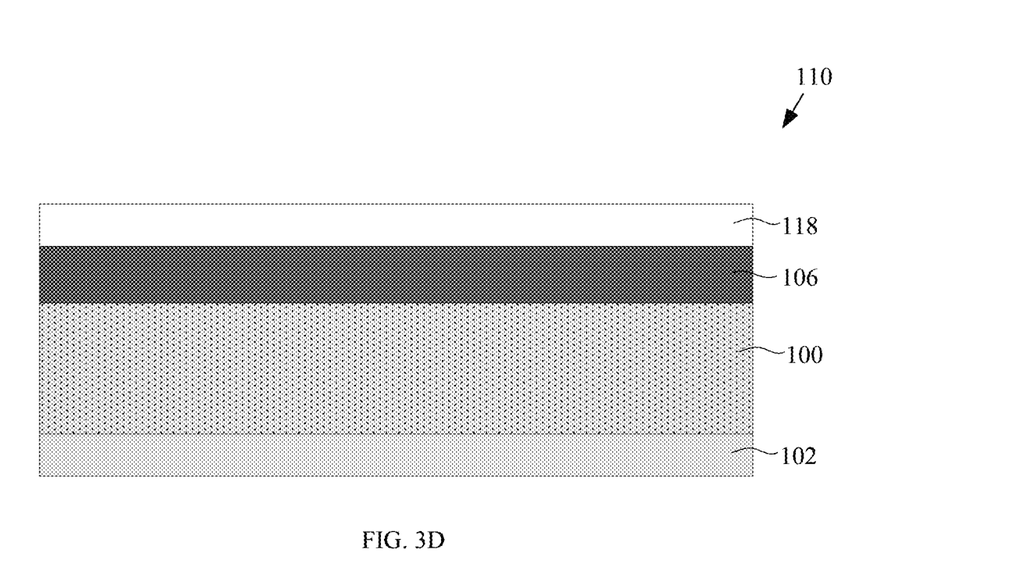
FIG. 3D is a cross-section view of a partially completed semiconductor device after formation of a metal germanosilicide layer, according to embodiments of the disclosure.

FIG. 3D is a cross-section view of a partially completed semiconductor device 110 after formation of a metal germanosilicide layer 106 on the substrate 100, according to embodiments of the disclosure. In embodiments, the formation of the metal germanosilicide layer 106 includes heating or annealing the layer of low melting point material 112, the layer of metal 116 and the substrate 100. In embodiments, an upper portion of the substrate 100 reacts with the low melting point material 112 and the metal layer 116 to form the metal germanosilicide layer 106. Low formation temperature of the metal germanosilicide layer 106 is achieved resulting in the formation of metal germanosilicide layer 106 with good characteristics. Devices present in the active layer 102 are not affected by the metal germanosilicide layer 106 formation. In embodiments, the metal germanosilicide layer 106 formation has negligible effect on the devices present in the active layer 102.

In embodiments, the annealing is a laser anneal. Laser light is transmitted through the encapsulation material 118 during the formation of the metal germanosilicide layer 106. The metal germanosilicide layer 106 may be covered by the encapsulation material 118. The encapsulation material 118 protects the underlying metal layer 116 and promotes contact between the underlying metal layer 116, low melting point material 112 and the substrate 100 during laser annealing. Laser annealing induces localized heating of the metal layer 116, low melting point material 112 and an upper portion of the substrate 100. A lower portion of the substrate 100 and the active layer 102 are not affected or minimally affected during laser annealing and are maintained at room temperature.

In embodiments, the encapsulation material 118 includes a material having an optical transmissivity so that about 90 percent or more of the laser light energy is transmitted to the underlying metal layer 116. The encapsulation material 118 may include dielectric materials such as silicon dioxide, silicon nitride, silicon oxynitride, polysilicon, any other suitable material or its combination.

In some embodiments, the annealing is rapid thermal annealing, furnace anneal or any other suitable annealing processes. Rapid thermal annealing and furnace anneal may be used for high production throughput. When complete, the semiconductor device 110 may be used as metal semiconductor contacts.

Figure 3E:
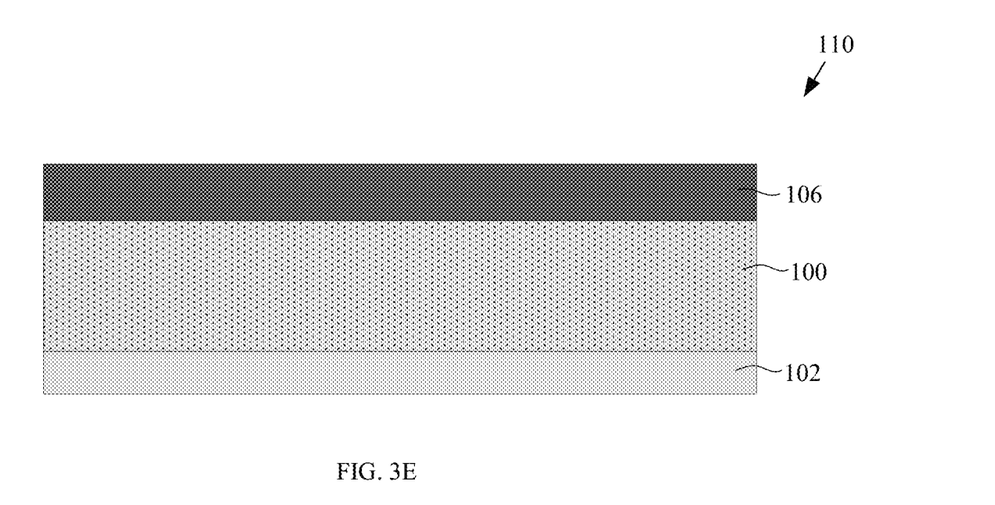
FIG. 3E is a cross-section view of a semiconductor device after removal of the encapsulation material, according to embodiments of the disclosure.

FIG. 3E is a cross-section view of a semiconductor device 110 after removal of the encapsulation material 118, according to embodiments of the disclosure. The encapsulation material 118 may be removed by wet etch or dry etch processes. The semiconductor device 110 is identical to the semiconductor device 110 illustrated in FIG. 1 with the orientation reversed. The semiconductor device 110 includes a substrate 100 and a metal germanosilicide layer 106 above the substrate 100. The active layer 102 may be placed below the substrate 100.

Figure 4A:
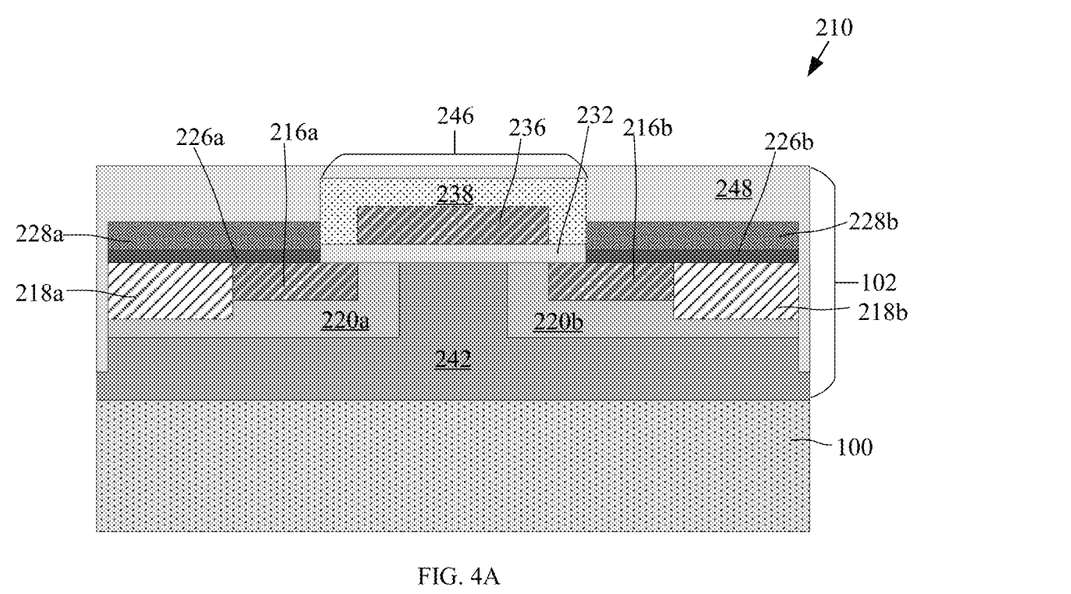
FIG. 4A is a cross-section view of a partially completed vertical drain transistor, according to embodiments of the disclosure.
Figure 4B:
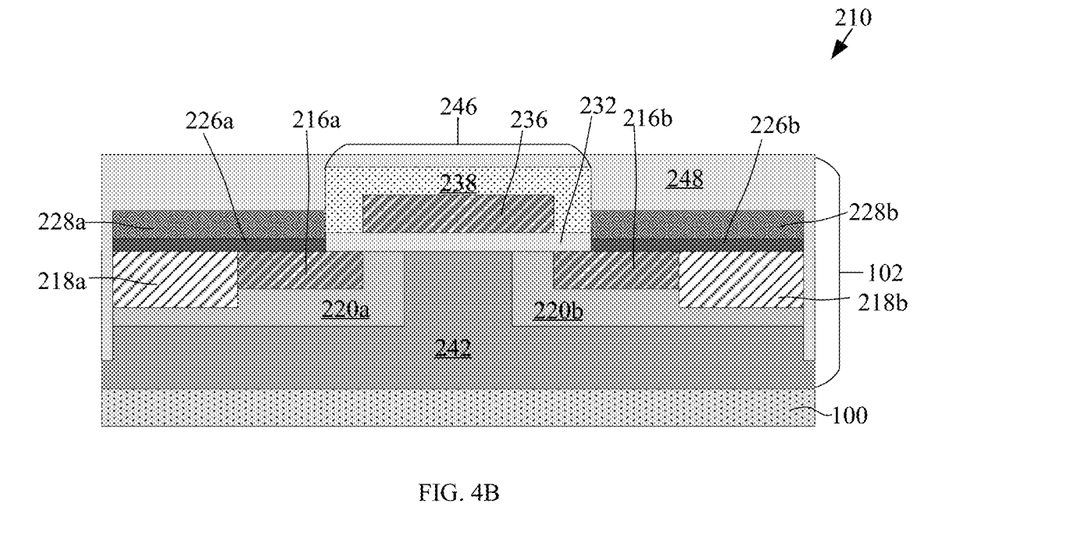
FIG. 4B is a cross-section view of a partially completed vertical drain transistor after removal of a portion of a substrate, according to embodiments of the disclosure.
Figure 4C:
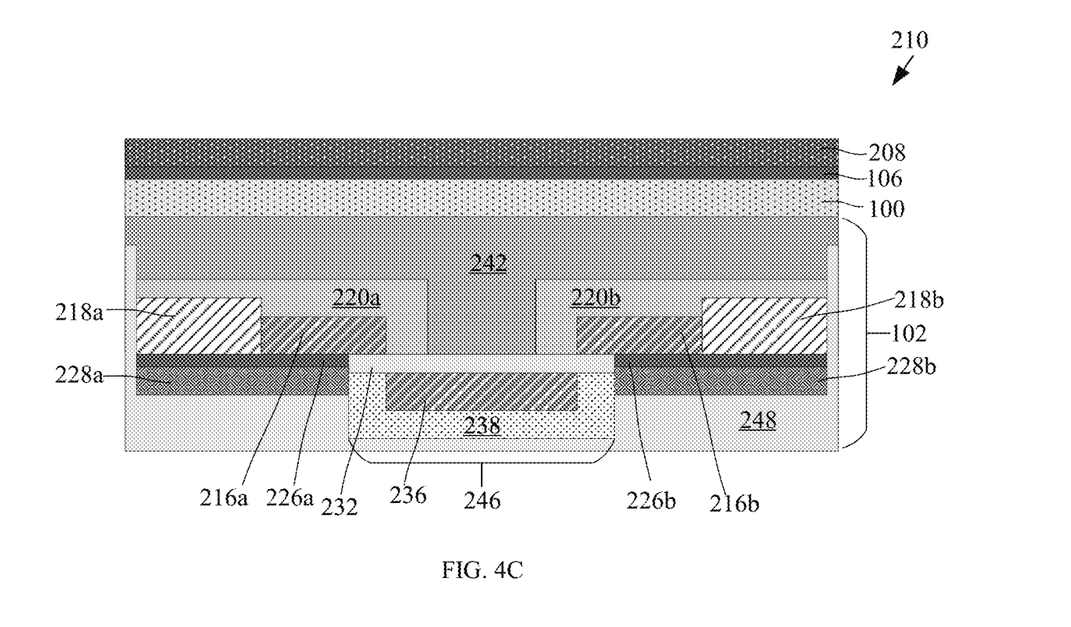
FIG. 4C is a cross-section view of a vertical drain transistor after formation of a metal germanosilicide layer over the substrate, according to embodiments of the disclosure.

FIGS. 4A to 4C show a fabrication of bottom substrate contact formation process flow for the vertical drain transistor 210 shown in FIG. 2, according to embodiments of the disclosure. FIG. 4A is a cross-section view of a partially completed vertical drain transistor 210, according to embodiments of the disclosure. Referring to FIG. 4A, a substrate 100 is provided. The substrate 100 may include an active layer 102 formed on the substrate 100. The active layer 102 is identical to the active layer 102 of the vertical drain transistor 210 illustrated in FIG. 2.

FIG. 4B is a cross-section view of a partially completed vertical drain transistor 210 after removal of a portion of the substrate 100, according to embodiments of the disclosure. A portion of the substrate 100 placed opposite to the active layer 102 may be removed. The removal process may be by grinding or polishing leaving behind a portion of the substrate 100 and the active layer 102 placed above the substrate 100. A chemical cleaning process may be applied on the substrate 100 after the removal process.

FIG. 4C is a cross-section view of a vertical drain transistor 210 after formation of a metal germanosilicide layer 106 on the substrate 100, according to embodiments of the disclosure. Although not shown, the formation of the metal germanosilicide layer 106 may include depositing a layer of low melting point material over the substrate 100, depositing a layer of metal over the layer of low melting point material and annealing to form the metal germanosilicide layer 106 on the substrate 100. In embodiments, the annealing may be a laser anneal. An encapsulation material may be formed over the metal layer prior to annealing to form the metal germanosilicide layer 106. The encapsulation material may be subsequently removed after the annealing process to form the metal germanosilicide layer 106. Referring to FIG. 4C, a layer of metal 208 may be deposited over the metal germanosilicide layer 106. The metal layer 208 may be deposited by ALD, CVD, PVD or any other suitable deposition processes. In embodiments, the metal layer 208 may be made of titanium (Ti), nickel (Ni), silver (Ag), cobalt, platinum, palladium, any other metal or its combinations. In embodiments, the metal layer 208 provides a metal contact for the metal germanosilicide layer 106 and the substrate 100.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed:

1. A semiconductor device comprising:
    a substrate having a first surface and a second surface, the substrate comprising a wide bandgap semiconductor material of silicon carbide;
    an epitaxial layer on the first surface of the substrate; and
    a first layer of metal germanosilicide compound on the second surface of the substrate, wherein the first layer of metal germanosilicide compound is continuous, has a uniform thickness, and forms an ohmic contact to the substrate.

2. The semiconductor device of claim 1, further comprising:
    a second layer of metal germanosilicide compound above the epitaxial layer; and
    wherein the second layer of metal germanosilicide compound forms an ohmic contact to the epitaxial layer.

3. The semiconductor device of claim 1, wherein the epitaxial layer comprises gallium nitride, aluminum gallium nitride, indium gallium nitride, silicon oxides, gallium oxides, aluminum oxides or indium oxides.

4. The semiconductor device of claim 1, wherein the first layer of metal germanosilicide compound comprises chemically bonded metal, silicon and germanium, and the first layer of metal germanosilicide compound has a range in ratio of silicon to germanium between 95:5 to 60:40.

5. The semiconductor device of claim 4, wherein the metal comprises titanium, nickel, cobalt, chromium, palladium, zirconium, platinum or tantalum.

6. The semiconductor device of claim 1, wherein the first layer of metal germanosilicide compound contains carbon.

7. The semiconductor device of claim 1, wherein the semiconductor device is a vertical device.

8. The semiconductor device of claim 1, further comprising:
    a contact metal layer above the first layer of metal germanosilicide compound.

9. The semiconductor device of claim 8, wherein the contact metal layer comprises nickel, palladium, platinum, aluminum or titanium.

10. The semiconductor device of claim 1, wherein the first layer of metal germanosilicide compound covers the second surface of the substrate.

11. A semiconductor device comprising:
    a substrate having a first surface and a second surface, the substrate comprising a wide bandgap semiconductor material of silicon carbide;
    an epitaxial layer on the first surface of the substrate;
    a first layer of metal germanosilicide compound on the second surface of the substrate, wherein the first layer of metal germanosilicide compound is continuous, has a uniform thickness, and forms an ohmic contact to the substrate; and
    a second layer of metal germanosilicide compound above the epitaxial layer, wherein the second layer of metal germanosilicide compound forms an ohmic contact to the epitaxial layer.

12. The semiconductor device of claim 11, wherein the first layer of metal germanosilicide compound and the second layer of metal germanosilicide compound are at least partially crystalline.

13. The semiconductor device of claim 11, wherein the first layer of metal germanosilicide compound and the second layer of metal germanosilicide compound comprise chemically bonded metal, silicon and germanium, and the first layer of metal germanosilicide compound and the second layer of metal germanosilicide compound have a range in ratio of silicon to germanium between 95:5 to 60:40.

14. The semiconductor device of claim 13, wherein the metal comprises titanium, nickel, cobalt, chromium, palladium, zirconium, platinum or tantalum.

15. A method of fabricating a semiconductor device comprising:
    forming a layer of metal germanosilicide compound on a substrate, wherein the substrate comprises a wide bandgap semiconductor material of silicon carbide having a first surface and a second surface; and
    forming an epitaxial layer on the first surface of the substrate, the layer of metal germanosilicide compound is formed on the second surface of the substrate, and the layer of metal germanosilicide compound is continuous, has a uniform thickness, and forms an ohmic contact to the substrate.

16. The method of claim 15, wherein forming the layer of metal germanosilicide compound further comprises:
    forming a layer of low melting point material on the second surface of the substrate, wherein the low melting point material comprises germanium, silicon germanium or silicon;
    forming a layer of metal on the layer of low melting point material; and
    heating to form the layer of metal germanosilicide compound on the second surface of the substrate.

17. The method of claim 16, wherein the heating is a laser anneal;
    forming the layer of low melting point material comprises depositing a layer of low melting point material; and
    forming the layer of metal comprises depositing a layer of metal.

18. The method of claim 16, further comprising:
    forming an encapsulation material on the layer of metal prior to heating to form the layer of metal germanosilicide compound.

* * * * *